United States Patent
Son

(10) Patent No.: US 7,988,817 B2
(45) Date of Patent: Aug. 2, 2011

(54) LIFT PIN DRIVING DEVICE AND A FLAT PANEL DISPLAY MANUFACTURING APPARATUS HAVING SAME

(75) Inventor: Hyoung Kyu Son, Seoul (KR)

(73) Assignee: ADP Engineering Co., Ltd., Seongnam-si (KR)

(*) Notice: Subject to any disclaimer, the term of this patent is extended or adjusted under 35 U.S.C. 154(b) by 100 days.

(21) Appl. No.: 11/874,272

(22) Filed: Oct. 18, 2007

(65) Prior Publication Data

US 2008/0110397 A1    May 15, 2008

(30) Foreign Application Priority Data

Nov. 10, 2006  (KR) .................. 10-2006-0111227
Nov. 10, 2006  (KR) .................. 10-2006-0111241

(51) Int. Cl.
*C23C 16/00*  (2006.01)
*C23F 1/00*   (2006.01)
*H01L 21/306* (2006.01)

(52) U.S. Cl. .............. 156/345.54; 118/728; 118/729; 156/345.51

(58) Field of Classification Search .......... 118/715, 118/720, 721, 722, 724, 725, 728; 156/345.1, 156/345.51, 345.54; 269/254 CS, 266, 903
See application file for complete search history.

(56) References Cited

U.S. PATENT DOCUMENTS

| 4,788,994 | A | * | 12/1988 | Shinbara | 134/157 |
| 5,226,056 | A | * | 7/1993 | Kikuchi et al. | 373/18 |
| 5,355,744 | A | * | 10/1994 | Yanagisawa | 74/490.09 |
| 6,739,208 | B2 | * | 5/2004 | Hyakudomi | 73/865.8 |
| 6,789,585 | B1 | * | 9/2004 | Janke | 141/198 |
| 7,018,555 | B2 | * | 3/2006 | Shimbara et al. | 216/92 |

FOREIGN PATENT DOCUMENTS

JP    01091923 A * 4/1989

OTHER PUBLICATIONS

English Machine Translation of JP01-091923A. Performed and printed on Mar. 10, 2010 from http://www4.ipdl.inpit.go.jp/.*

* cited by examiner

*Primary Examiner* — Maureen Gramaglia
*Assistant Examiner* — Tiffany Nuckols
(74) *Attorney, Agent, or Firm* — KED & Associates, LLP

(57) ABSTRACT

A lift pin driving device and a flat panel display (FPD) manufacturing apparatus having the device are provided. The lift pin driving device can precisely move a plurality of lift pins using one motor, thus realizing a simple lift pin driving structure and a simple motor control structure. This allows a space below a chamber body of the manufacturing apparatus to be configured in a variety of ways, thus reducing the cost of equipment and the production cost of products.

12 Claims, 15 Drawing Sheets

LIFT PIN DRIVING DEVICE AND A FLAT PANEL DISPLAY MANUFACTURING APPARATUS HAVING SAME

This application claims the benefit of Korean Patent Application Nos. 10-2006-0111227 filed on Nov. 10, 2006; and 10-2006-0111241 filed Nov. 10, 2006, the entirety of which are incorporated herein by reference.

BACKGROUND

1. Field

This relates to lift pin modules used in a semiconductor/flat panel display (FPD) manufacturing apparatus.

2. Background

Flat Panel Displays (FPDs) may include, for example, LCDs (Liquid Crystal Displays), PDPs (Plasma Display Panels) and OLEDs (Organic Light Emitting Diodes). A manufacturing apparatus used for manufacturing FPDs may include a plurality of vacuum treatment devices, such as, for example, a load lock chamber, a transfer chamber and a process chamber, for treating the surface of a substrate.

The load lock chamber may receive raw substrates from the outside, and may also distribute processed substrates to the outside. The transfer chamber may include a transfer robot that transfers substrates between chambers, thus feeding the raw substrates from the load lock chamber to the process chamber and returning the processed substrates from the process chamber to the load lock chamber. The substrates may be processed in the process chamber by, for example, forming respective layers on the substrates or etching the substrates using plasma or thermal energy in a vacuum. Lift pins that lift the substrates may be provided in the chambers to facilitate the loading and unloading of substrates from the chambers. Consistent, stable movement and placement of the substrates may simplify the manufacturing process and yield a higher quality FPD.

BRIEF DESCRIPTION OF THE DRAWINGS

The embodiments will be described in detail with reference to the following drawings in which like reference numerals refer to like elements wherein.

DETAILED DESCRIPTION

Figure 1:
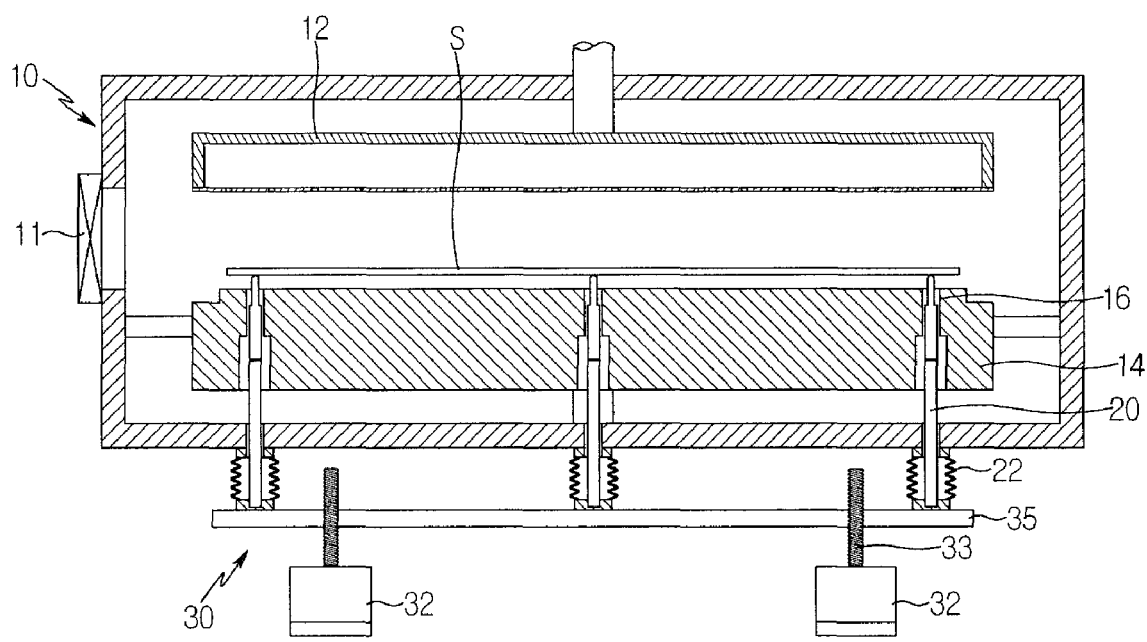
FIG. 1 is a sectional view of an exemplary process chamber.

Reference will now be made in greater detail to various embodiments, examples of which are illustrated in the accompanying drawings. Wherever possible, the same reference numerals will be used throughout the drawings and the description to refer to the same or like parts.

The exemplary process chamber shown in FIG. 1 may include a chamber body 10, and a gate 11 capable of maintaining a vacuum state in the chamber body 10. The process chamber may also include an upper electrode assembly 12 and a lower electrode assembly 14. The lower electrode assembly 14 may support a substrate S thereon. The upper electrode assembly 12 may include a shower head (not shown) for spraying process gas onto the substrate S.

The lower electrode assembly 14 may include a plurality of lift pins 20 that can move the substrate S in the vertical direction for loading or unloading of the substrate S. The lower electrode assembly 14 may also include a plurality of pinholes 16 through which the lift pins 20 may movably pass. Thus, the lift pins 20 may be moved upwards or downwards within the respective pinholes 16, thereby moving the substrate S positioned on the upper surface of the lower electrode assembly 14.

For example, when a substrate S has been transferred from the outside into the chamber body 10 by a transfer unit (not shown), the lift pins 20 may ascend to a predetermined height to receive the substrate S, and maintain the substrate S positioned thereon at the predetermined height. After the transfer unit is moved from the chamber body 10, the lift pins 20 may lower the substrate S and load the substrate S onto the upper surface of the lower electrode assembly 14. Likewise, to discharge a processed substrate S to an outside of the chamber body 10, the lift pins 20 may lift the processed substrate S off of the upper surface of the lower electrode assembly 14, thus allowing the substrate S to be discharged to the outside of the chamber body 10.

The lift pins 20 may be moved by a lift pin driving device 30 that moves the plurality of lift pins 20 at the same time. The lift pin driving device 30 may include a pin plate 35 to which the plurality of lift pins 20 may be fixed. The lift pin driving device 30 may also include a drive motor 32 and a ball screw 33 to move the pin plate 35 upwards or downwards through a ball screw-type driving method. A bellows 22 may surround each of the lift pins 20 exposed between the lower surface of the chamber body 10 and the upper surface of the pin plate 35 to maintain a vacuum state inside the chamber body 10.

Figure 2:
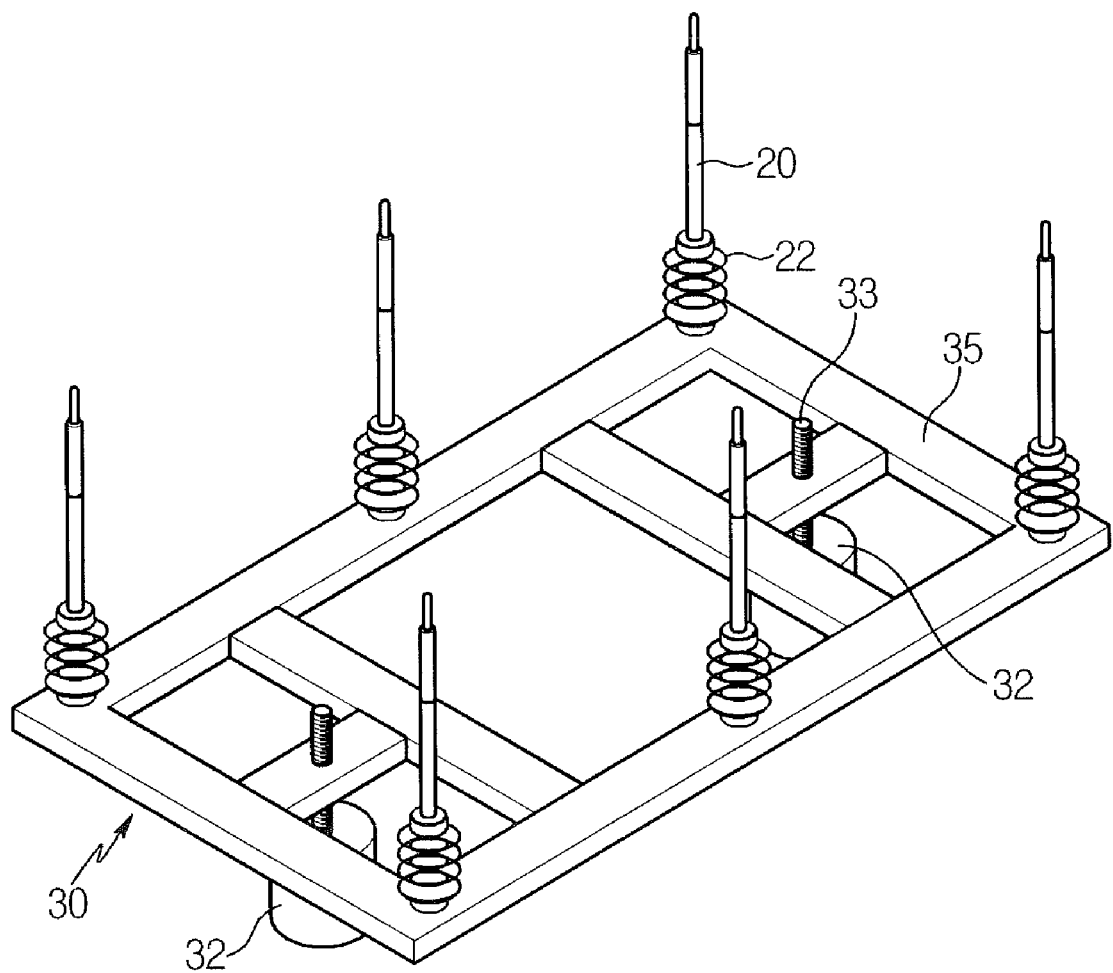
FIG. 2 is a perspective view of a lift pin driving device of the exemplary process chamber shown in FIG. 1.

To uniformly and stably move the pin plate 35 and the plurality of lift pins 20 upwards or downwards, the lift pin driving device 30 may include two or more appropriately positioned drive motors 32, as shown in FIG. 1 and FIG. 2. This allows for processing of larger FPD substrates S, as it would otherwise be difficult to uniformly or stably move the pin plate 35 and the lift pins 20 shown in FIG. 1 and FIG. 2 using only one drive motor 32.

To uniformly and stably move the lift pins 20 of the lift pin driving device 30 to a predetermined height at the same time, the drive motor 32 should be precisely controlled. When using two drive motors 32, it may be difficult to synchronize control of the two motors 32 to allow the motors 32 to simultaneously move the lift pins 20 to precisely the same height. If the two motors 32 are not precisely controlled and the pin plate 35 is, as a result, positioned at an incline, a phase difference may be generated between the lift pins 20 that may cause damage to the substrate S during loading or unloading. It may be difficult to perform a high quality substrate treatment when the lift pins 20 have such a phase difference.

A compensation control system may be used to monitor and control the motors 32 and compensate for any phase difference in the lift pins 20. However, the use of such a compensation control system may complicate the control structure of the manufacturing device and may increase the cost of equipment.

Figure 3:
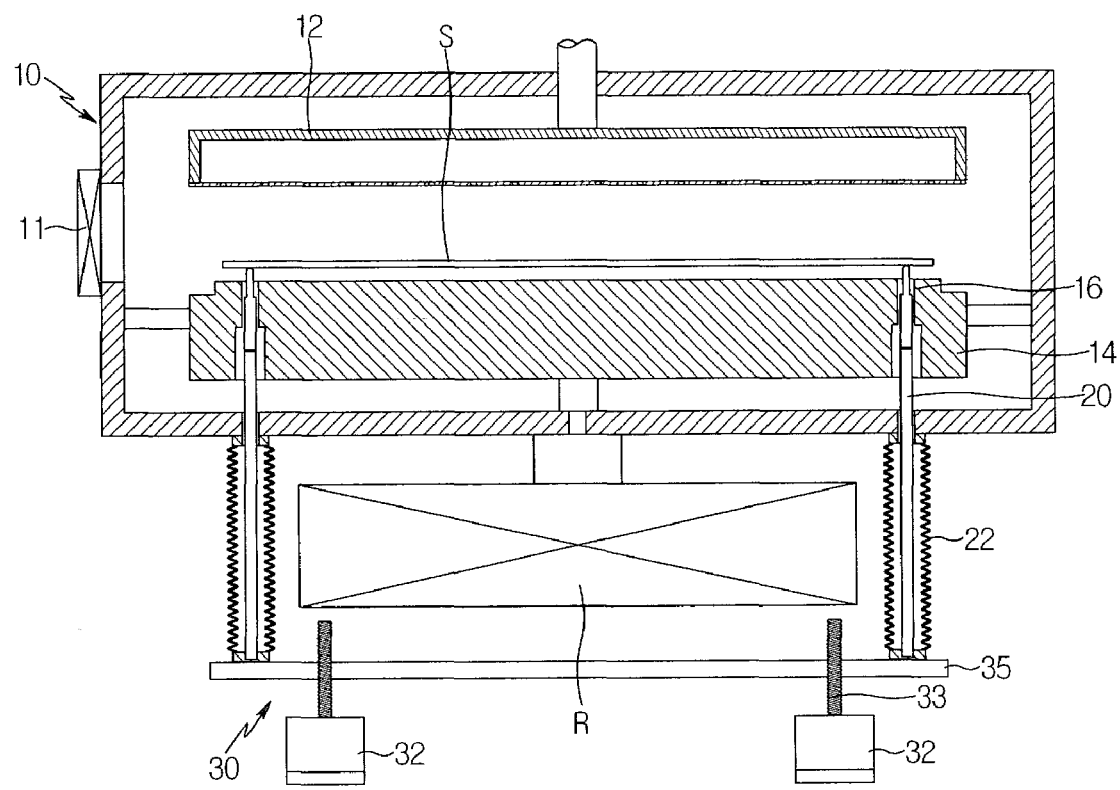
FIG. 3 is a sectional view of another exemplary process chamber.

The process chamber may be, for example, a PE (Plasma Enhanced) type chamber or an RIE (Reactive Ion Etching) type chamber, based on the type of plasma generation method used. In an RIE type process chamber, an electronic module for applying RF power may be installed in the space below the chamber body 10. Thus, space to accommodate the two drive motors 32 below the chamber body 10 of such an RIE type process chamber is limited, and the lift pin driving device 30 is then altered to operate in the space below the chamber body 10, as shown in FIG. 3. This type of installation, in which the lift pins 20 and bellows 22 are elongated, provides space for the installation of an electronic module, such as a matching box R, under the chamber body 10. However, because the lift pins 20 and the bellows 22 are longer, operation of the lift pin driving device 30 may become unstable.

Figure 4:
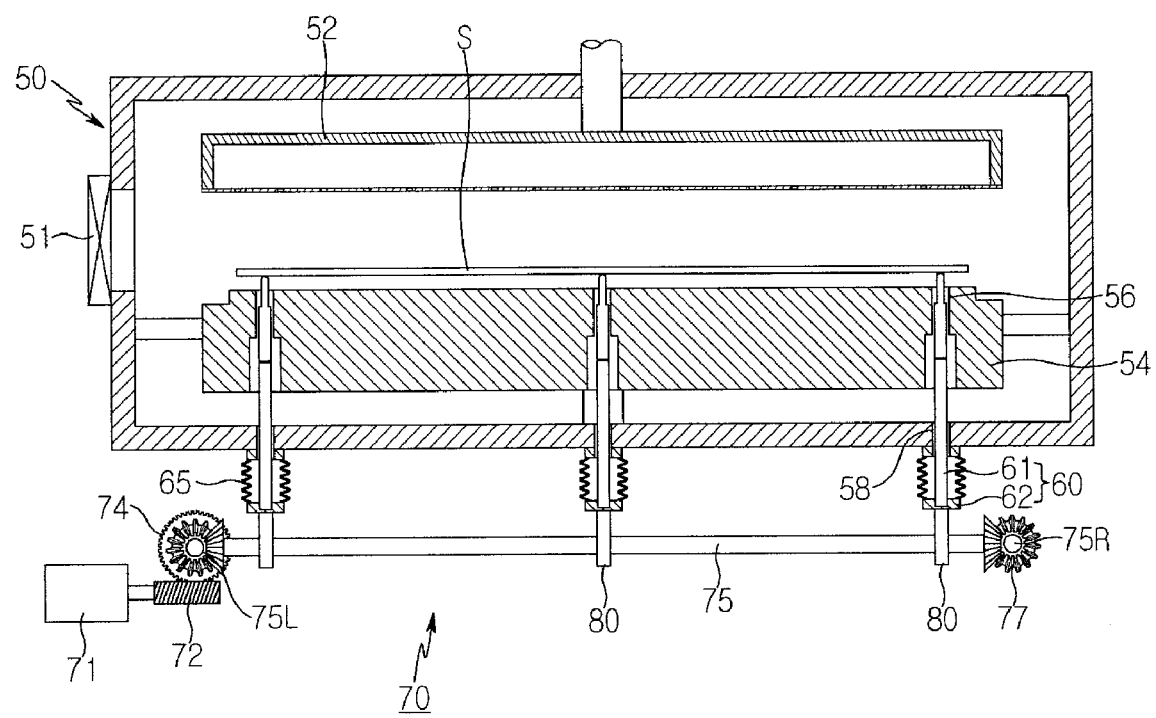
FIG. 4 is a sectional view of a process chamber having a lift pin driving device according to a first embodiment as broadly described herein.
Figure 5:
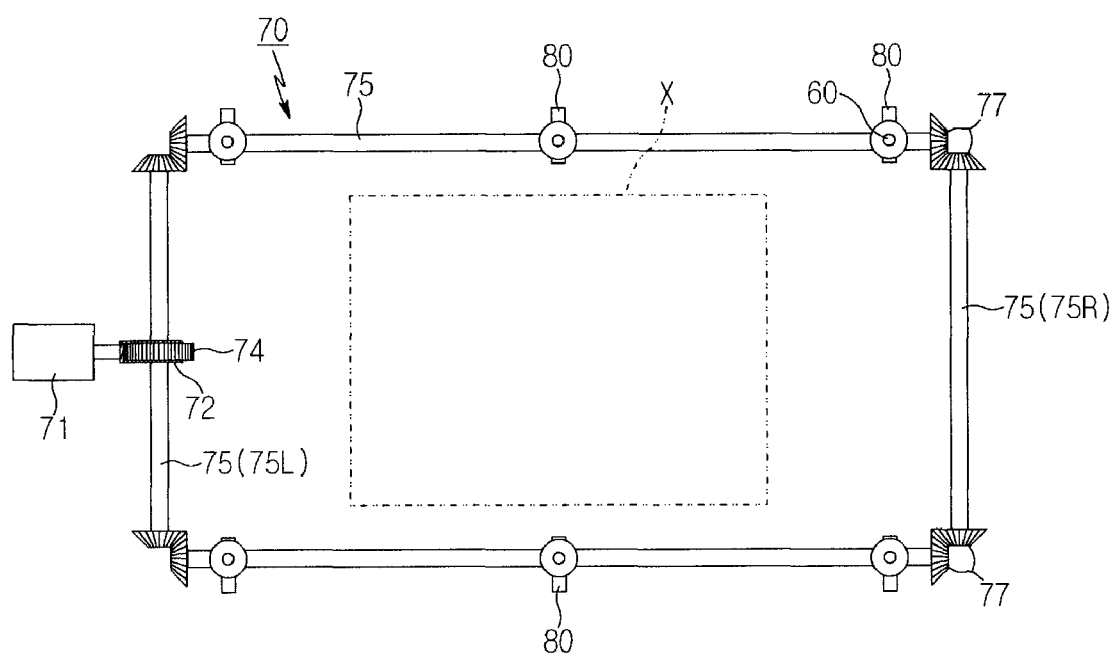
FIG. 5 is a plan view of the lift pin driving device shown in FIG. 4.
Figure 6:
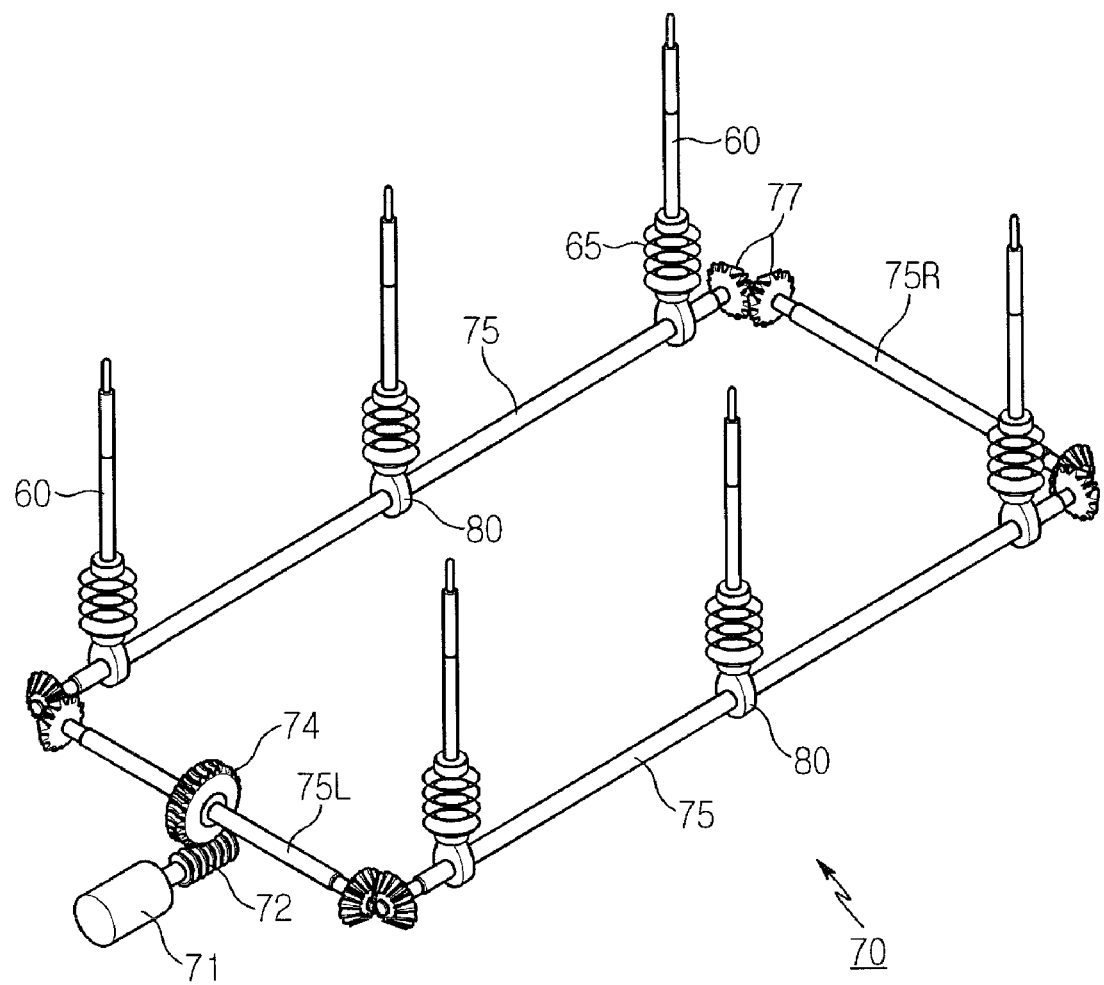
FIG. 6 is a perspective view of the lift pin driving device shown in FIG. 4 and FIG. 5.

A process chamber as shown in FIGS. 4 through 6 may include a chamber body 50, and an upper electrode assembly 52 and a lower electrode assembly 54 placed within upper and lower portions of the chamber body 50, respectively. The chamber body 50 may include a gate 51 for receiving and discharging a substrate S. The upper electrode assembly 52 may include a shower head (not shown) for spraying process gas onto the upper surface of the substrate S and treating the surface of the substrate S. The lower electrode assembly 54 may function as a substrate support unit so as to support a substrate S subjected to surface treatment in the chamber body 50.

A plurality of lift pins 60 may pass vertically through the lower electrode assembly 54 and move the substrate S upwards or downwards during a process of loading or unloading the substrate S. To allow the lift pins 60 to pass through the lower electrode assembly 54, the assembly 54 may include a pin passing unit comprising a plurality of pinholes 56.

A lift pin driving device 70 may be provided in a space below the chamber body 50. The chamber body 50 may also include a plurality of pinholes 58, which, together with the pinholes 56, form the pin passing unit, and allow the lift pins 60 to extend through the lower end of the chamber body 50 so that the lift pins 60 may be operated by the lift pin driving device 70.

The lift pin driving device 70 may include a plurality of cams 80 operated by one drive motor 71 to move the lift pins 60 upwards or downwards. As shown in FIG. 5 and FIG. 6, drive shafts 75 may be arranged in a space below the chamber body 50, in a square arrangement having four drive shafts 75 as shown, or other arrangement as appropriate. A power transmission unit may be provided, for example, at each corner of the square arrangement of four drive shafts 75, such that the power transmission units rotate at the same time. Each of the power transmission units may include, for example, bevel gears 77 which are engaged with each other to provide for this rotation.

One of the drive shafts 75 (in the drawings, the drive shaft 75L positioned on the left) may receive rotational power from the drive motor 71 through a worm gear unit having a worm 72 and a worm wheel 74. The worm gear unit may be positioned between the drive motor 71 and the drive shaft 75L so that the power of the motor 71 may be perpendicularly transmitted to the drive shaft 75L.

When the drive motor 71 is operated, the worm 72 and the worm wheel 74 engaged with the worm 72 rotate. This causes the four drive shafts 75, which are coupled to each other by the bevel gears 77, to rotate at the same time, thus moving the lift pins 60 upwards or downwards. Thus, the worm gear-type power transmission mechanism shown in FIG. 4 through FIG. 6 can transmit power at a reduced rotational speed of the drive motor 71, and without requiring the installation of an additional reduction gear.

In the embodiment shown in FIG. 4 through FIG. 6, three cams 80 are provided on each of two drive shafts 75. However, a number of cams 80 and the locations of the cams 80 may be adjusted as necessary. For example, the cams 80 may be instead or additionally provided on the left and/or right drive shafts 75L and 75R. Further, when the cams 80 are arranged as shown in FIG. 4 through FIG. 6, the right drive shaft 75R may be removed from the lift pin driving device 70.

The drive shafts 75 may be rotatably coupled in a variety of ways. For example, a bearing may be rotatably coupled to a bracket installed on the lower part of the chamber body 50, or may be fixed to a structure provided in the space below the chamber body 50. Other coupling arrangements may also be appropriate.

As described above, the lift pins 60 may be configured such that they are moved upwards or downwards by the cams 80. As shown in FIG. 4, the lift pins 60 may include pin parts 61, which may movably pass through the pinholes 56 and 58 of both the chamber body 50 and the lower electrode assembly 54, and contact parts 62, which may be formed as flat disc parts on the lower ends of the pin parts 61, and which may come into contact with the respective cams 80. A bellows 65 may be connected both to the lower surface of the chamber body 50 and to the contact part 62 of each of the lift pins 60 to seal off each of the pinholes 58 in the chamber body 50.

The lift pin driving device 70 shown in FIG. 4 through FIG. 6 is configured such that both the drive shafts 75 and the cams 80 may be rotated by one drive motor 71 to move the lift pins 60 upwards or downwards. Thus, the lift pin driving device 70 has a simple construction and can be more easily controlled than a device having two motors.

Further, no drive parts (such as a motor) are positioned in a central region X of the space below the chamber body 50, as shown in FIG. 5. Thus, the central region X may be efficiently used. Particularly, in an RIE type process chamber, it is possible to easily accommodate a large-scaled matching box R in the central region X of the space below the chamber body 50.

Although the construction of the lift pin driving device 70 shown in FIG. 4 through FIG. 6 has been described based on its use in a process chamber 50, it should be understood that this device 70 may be used with various other types of equipment that use these types of lift pins 60, such as a load lock chamber or a transfer chamber of an FPD manufacturing apparatus, semiconductor equipment, or other equipment as appropriate.

Figure 7:
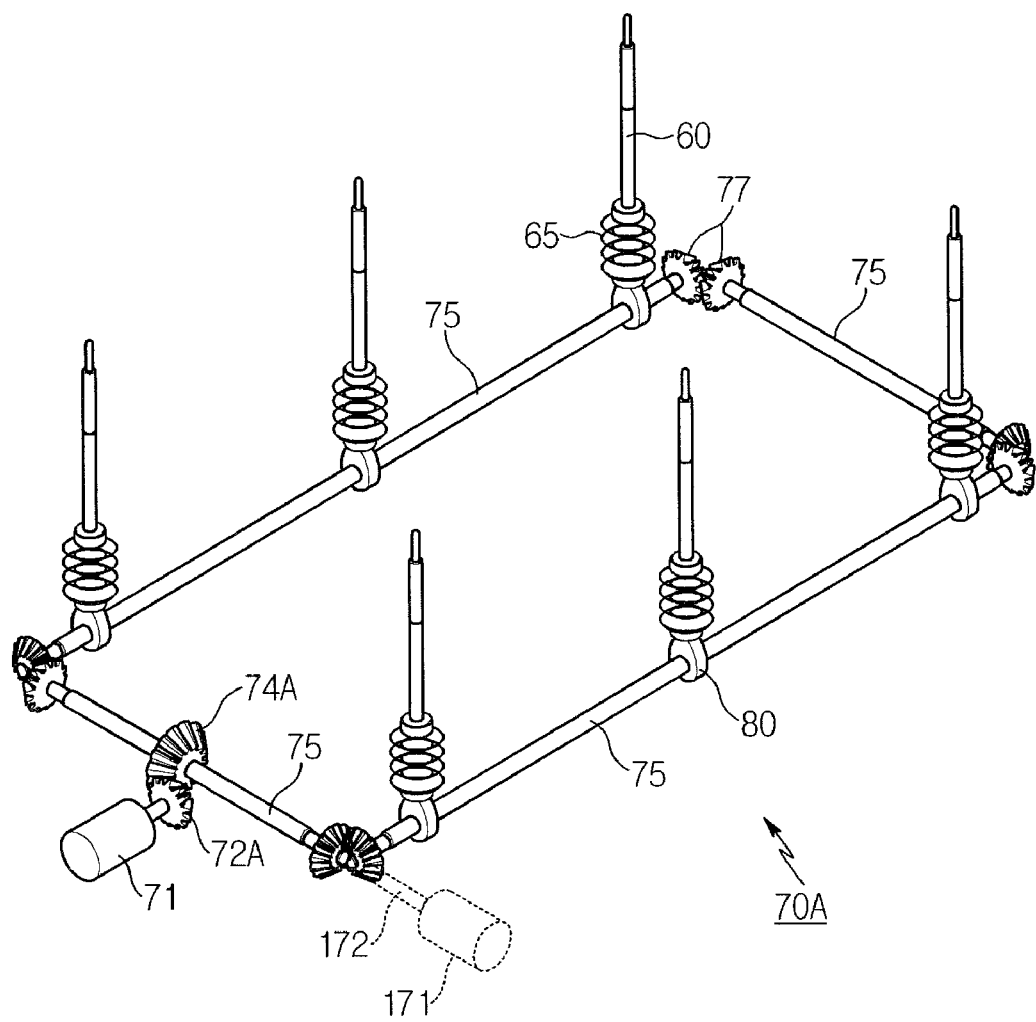
FIG. 7 is a perspective view of a lift pin driving device according to a second embodiment as broadly described herein.

FIG. 7 is a perspective view of a lift pin driving device according to another embodiment as broadly described herein. In this embodiment, the general shape of the lift pin driving device 70A may be similar to that of the embodiment shown in FIG. 4 through FIG. 6. However, in the device 70A shown in FIG. 7, the power transmission unit transmits power from the drive motor 71 to the drive shafts 75 using bevel gears 72A and 74A. The bevel gear 72A coupled to the drive motor 71 may be larger than the bevel gear 74A coupled to the drive shaft 75, as shown in FIG. 7. Further, in an alternative embodiment, a shaft 172 of a drive motor 171 (shown in shadow in FIG. 7) may be directly connected to one of the drive shafts 75. In this alternative embodiment, both the drive motor 71 and the bevel gears 72A and 74A may be eliminated.

Figure 8:
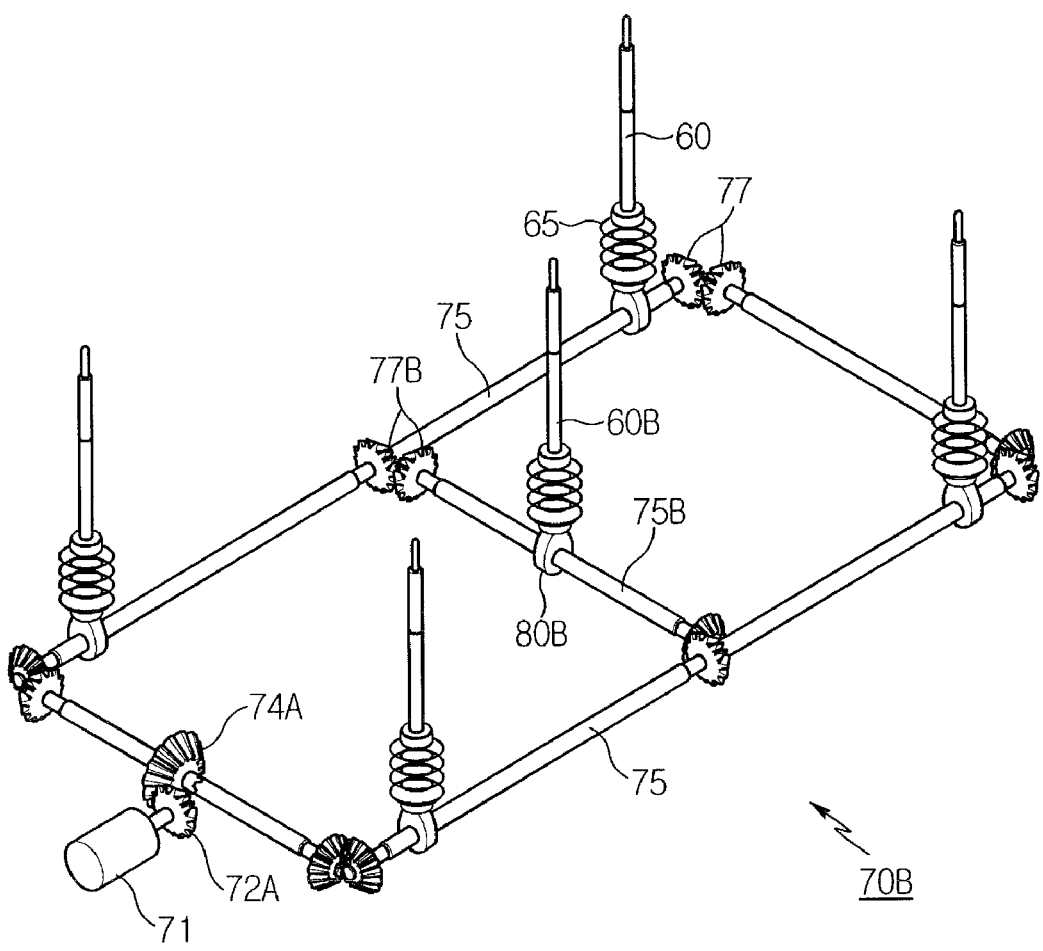
FIG. 8 is a perspective view of a lift pin driving device according to a third embodiment as broadly described herein.

FIG. 8 is a perspective view of a lift pin driving device according to another embodiment as broadly described herein. In this embodiment, the general shape of the lift pin driving device 70B may be similar to that of the embodiment shown in FIG. 7. However, the device 70B shown in FIG. 8 may include an additional drive shaft 75B in a central portion of the lift pin driving device 70B. The lift pin driving device 70B may be efficiently used with large-scaled equipment, in which a portion, such as, for example, a central area of a substrate may warrant additional support by an additional lift pin 60B, in addition to the support provided to peripheral portions of the substrate by the lift pins 60. This additional shaft 75B and lift pin 60B may be positioned outside the central area, based on the requirements of a particular substrate and capabilities of the equipment.

More specifically, as shown in FIG. 8, the additional drive shaft 75B may extend between opposite drive shafts 75, either perpendicular to the drive shafts 75, or at another angle as appropriate. The power transmission unit of the additional drive shaft 75B may include bevel gears 77B. A cam 80B may be provided on the additional drive shaft 75B to move the additional lift pin 60B upwards or downwards, simultaneously with the other lift pins 60. This additional structure may be formed in various ways by arranging the drive shafts 75 according to the locations and number of the lift pins 60 and 60B and by providing a power transmission unit comprising bevel gears 77B between neighboring drive shafts 75.

Figure 9:
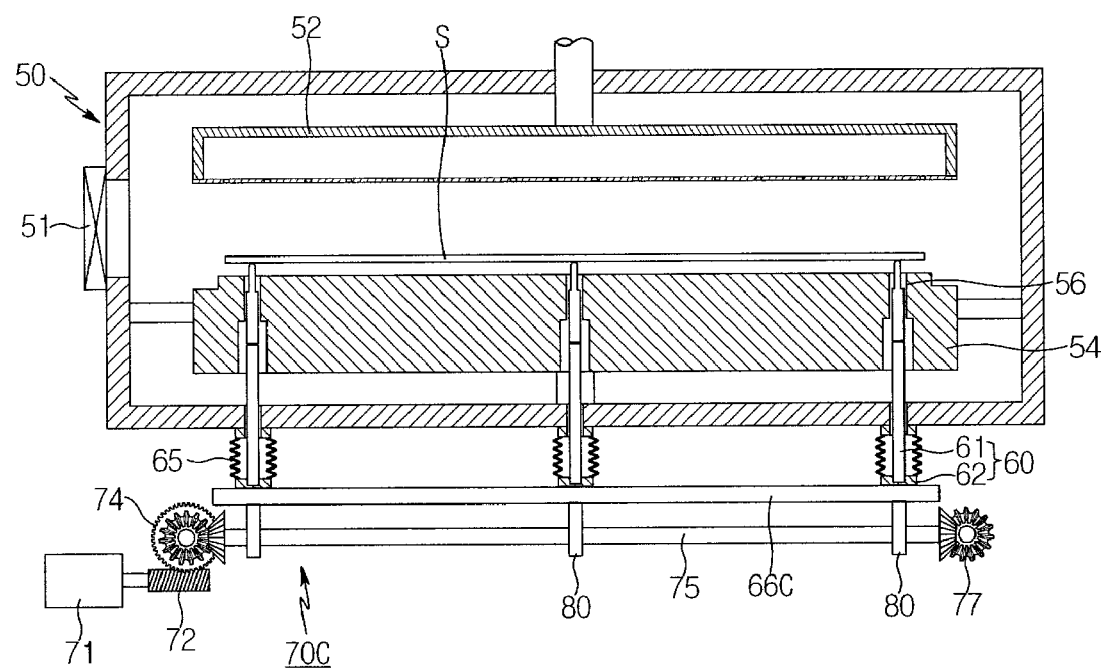
FIG. 9 is a sectional view of a process chamber having a lift pin driving device according to a fourth embodiment as broadly described herein.
Figure 10:
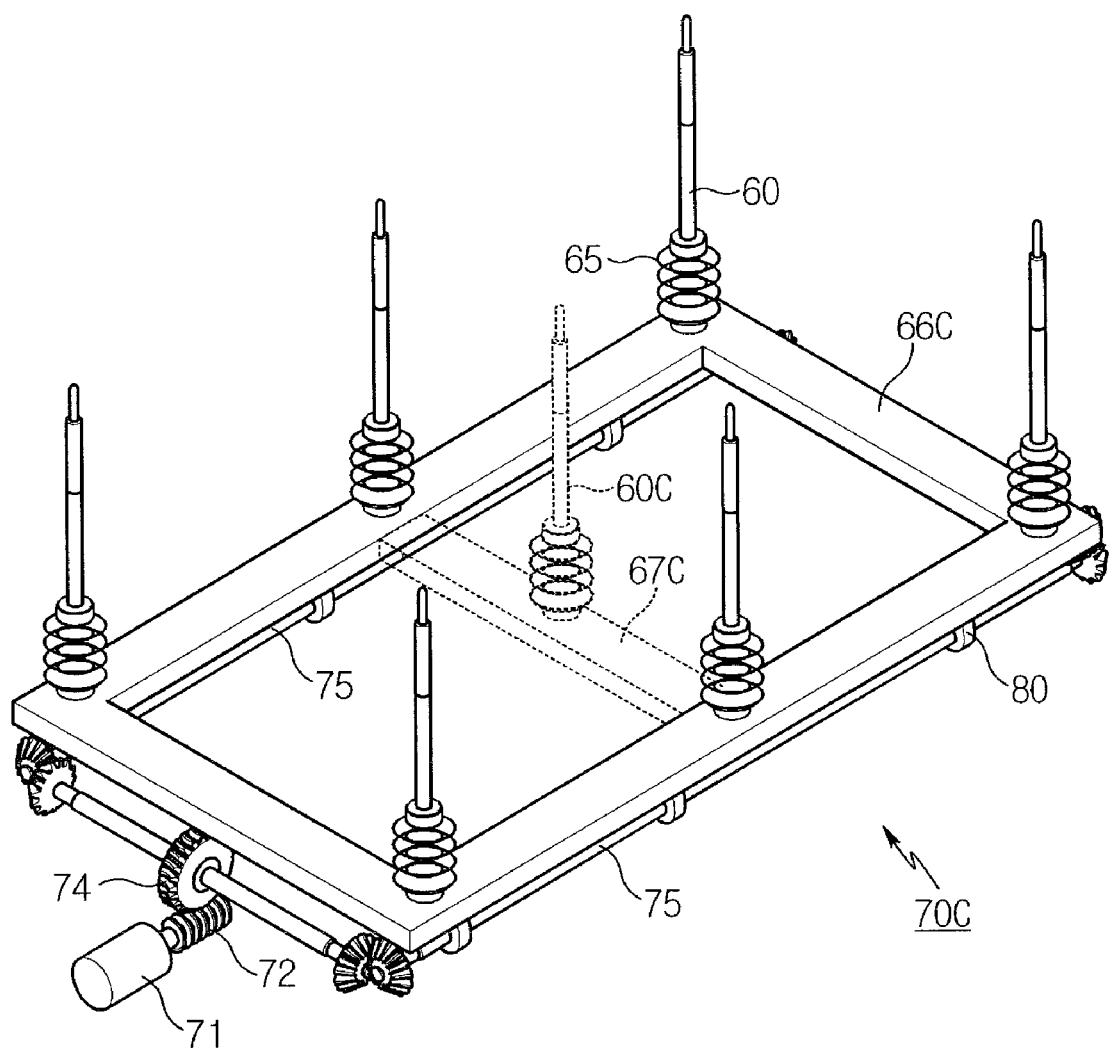
FIG. 10 is a perspective view of the lift pin driving device shown in FIG. 9.

FIG. 9 illustrates a process chamber having a lift pin driving device according to another embodiment as broadly described herein. In this embodiment, the general shape of the lift pin driving device 70C and the process chamber 50 having the device are similar to that of previous embodiments. However, in the device 70C shown in FIG. 9 and FIG. 10, the lift pins 60 may be mounted to a pin plate 66C. The pin plate 66C may have, for example, a rectangular frame shape, as shown in FIG. 10, or other shape as appropriate. The cams 80 provided on the drive shafts 75 may move the pin plate 66C upwards or downwards, thus moving the lift pins 60 coupled thereto upwards or downwards.

The pin plate 66C may be configured in a variety of different ways by changing the locations of the cams 80, which are not limited to the locations of the lift pins 60. Use of the pin plate 66C may more stably and precisely move the plurality of lift pins 60 simultaneously upwards or simultaneously downwards using one drive motor 71.

Further, in an alternative embodiment, an additional lift pin 60C (shown in shadow in FIG. 10) may be provided, for example, in a central region of the lift pin driving device 70C. In this alternative embodiment, an additional pin plate 67C may extend across the rectangular frame-shaped pin plate 66C and the lift pin 60C may be installed on the additional pin plate 67C. This structure may be efficiently used with a system having a large size. When the two types of pin plates 66C and 67C are used in the lift pin driving device 70C, both the additional drive shaft 75B and the additional cam 80B shown in FIG. 8 may be eliminated.

Figure 11:
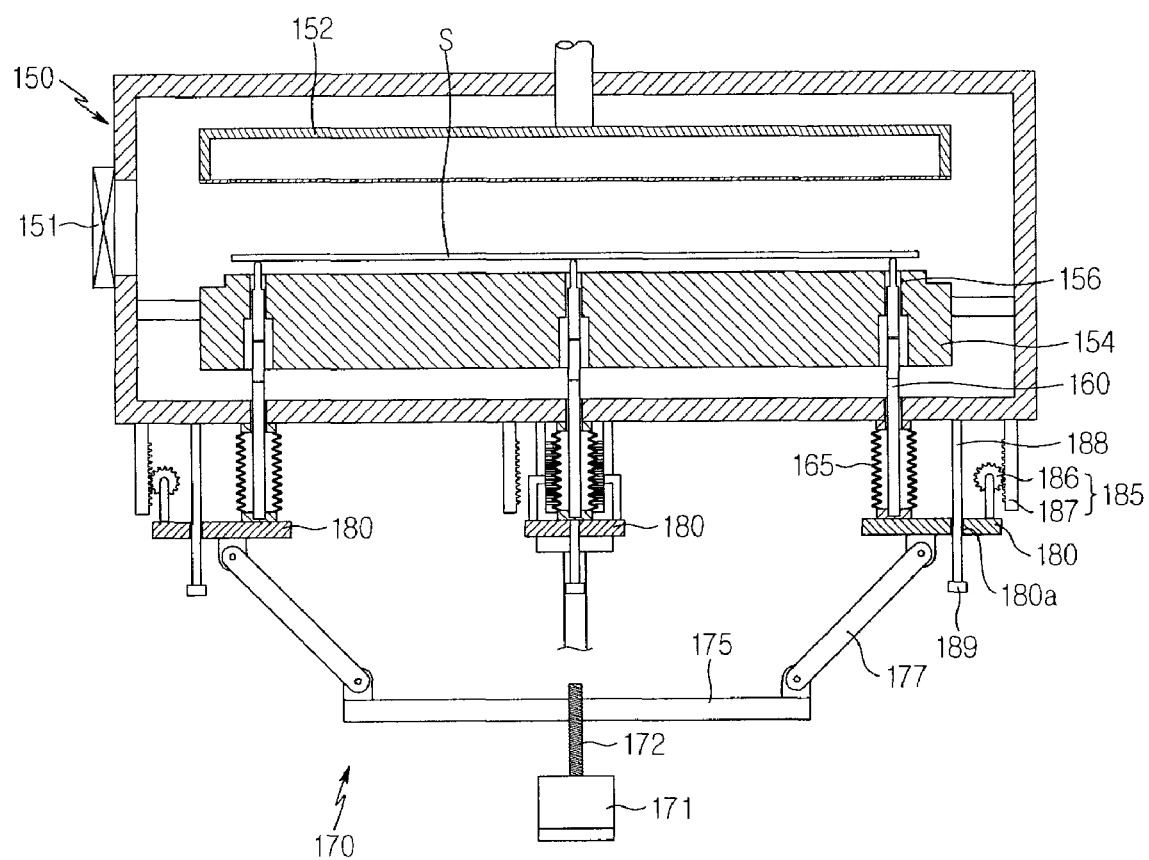
FIG. 11 is a sectional view of a process chamber having a lift pin driving device according to a fifth embodiment as broadly described herein.
Figure 12:
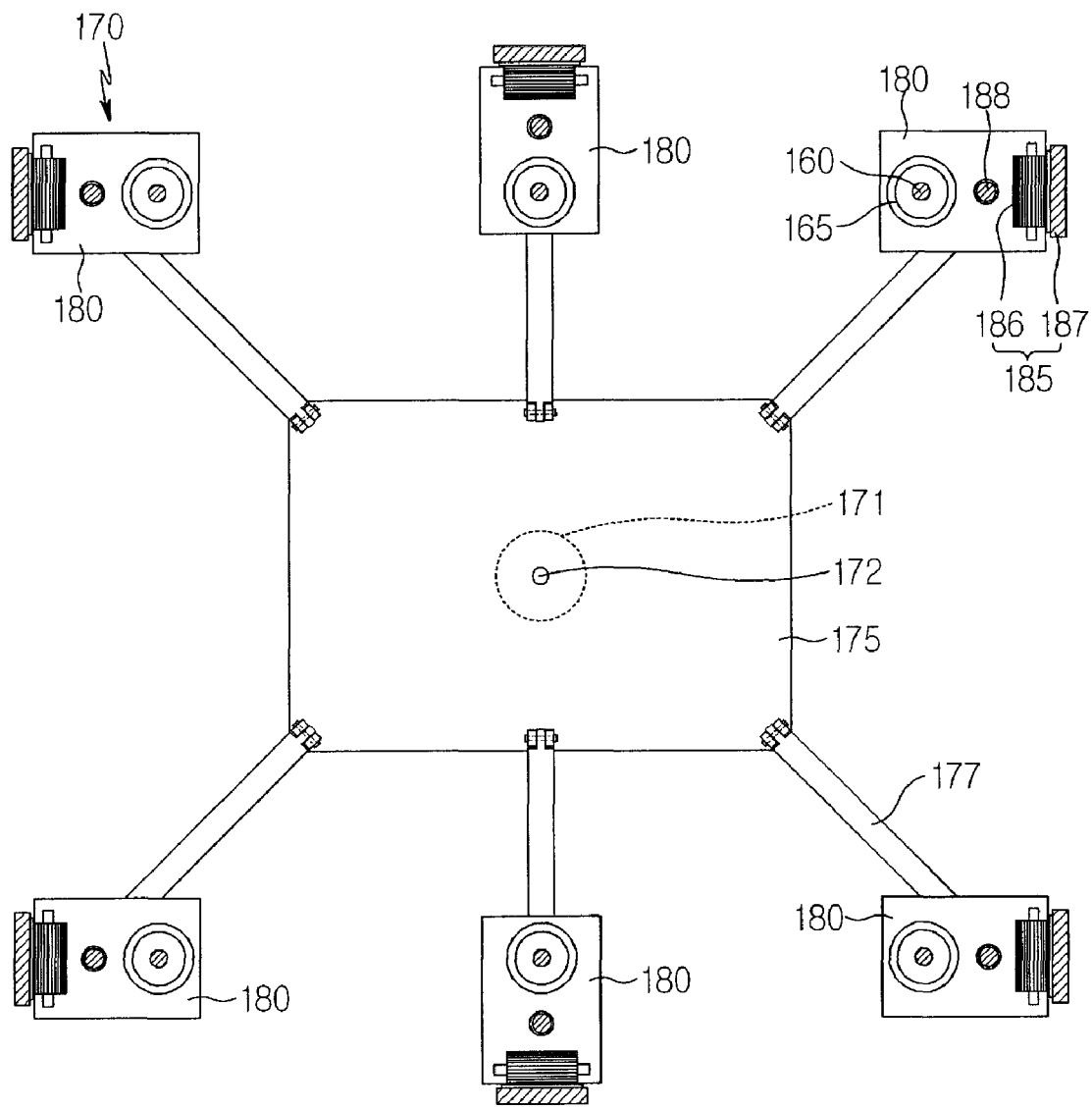
FIG. 12 is a plan view of the lift pin driving device shown in FIG. 11.
Figure 13:
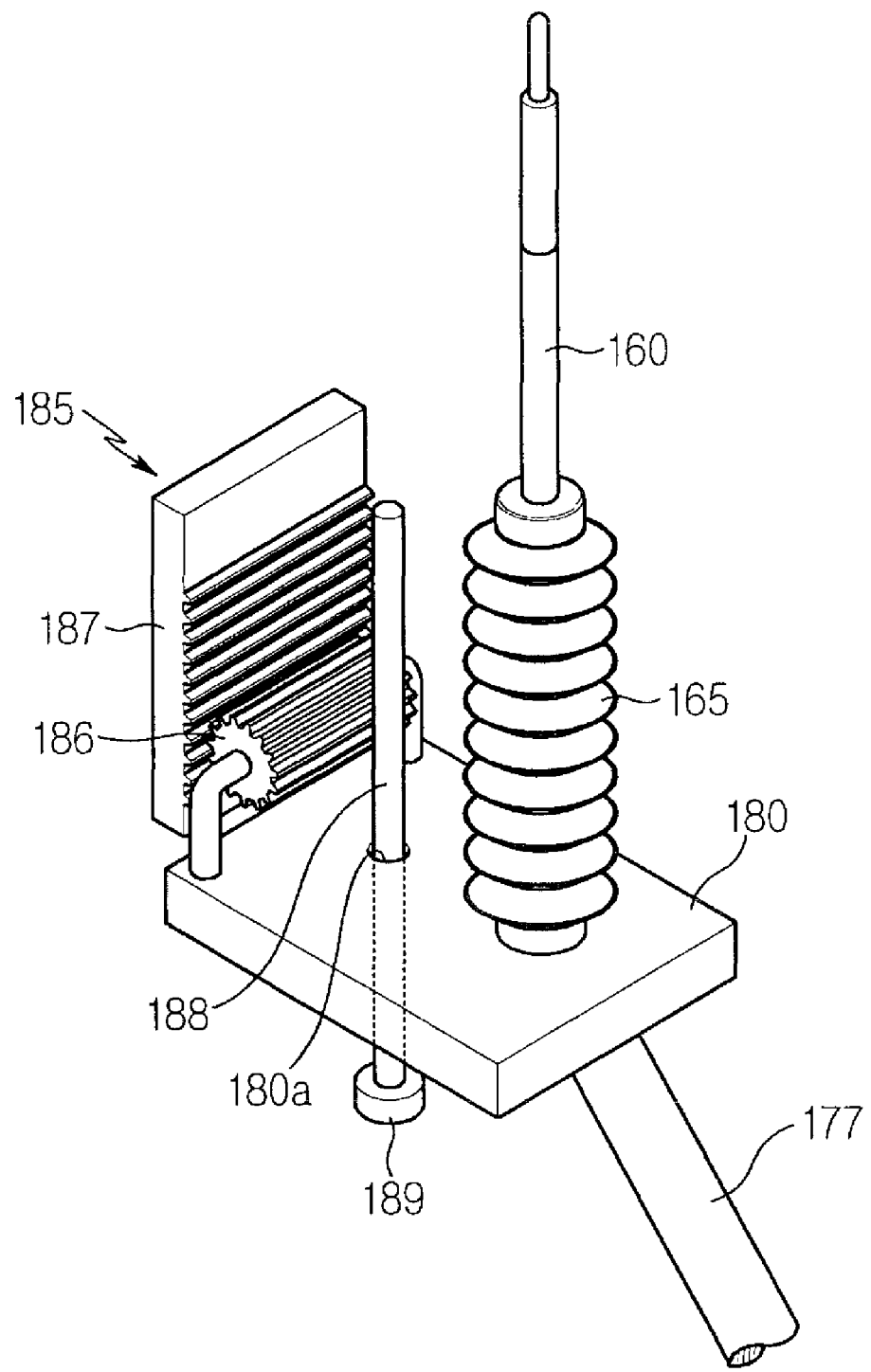
FIG. 13 is a partial perspective view of a portion of the lift pin driving device shown in FIG. 11 and FIG. 12.

FIG. 11 through FIG. 13 are views of a process chamber having a lift pin driving device according to another embodiment. The process chamber may be used for manufacturing FPDs, and may include a chamber body 150 in which a substrate S may be surface-treated in a vacuum state. The chamber body 150 may include an upper electrode assembly 152 and a lower electrode assembly 154 in upper and lower portions thereof, and a gate 151 for receiving and discharging a substrate S. The upper electrode assembly 152 may include a shower head (not shown) for spraying process gas onto the upper surface of the substrate S and treating the surface of the substrate S. The lower electrode assembly 154 may function as a substrate support unit that supports a substrate S being subjected to surface treatment in the chamber body 150.

A plurality of lift pins 160 may pass vertically through the lower electrode assembly 154 to move the substrate S upwards or downwards during a process of loading or unloading the substrate S. To allow the lift pins 160 to pass through the lower electrode assembly 154, the assembly 154 may include a pin passing unit comprising a plurality of pinholes 156.

A lift pin driving device 170 may be provided in the space below the chamber body 150. The chamber body 150 may also include a plurality of pinholes 158, which, together with the pinholes 156, form the pin passing unit, and allow the lift pins 160 to extend through the lower end of the chamber body 150 so that the lift pins 160 may be operated by the lift pin driving device 170.

The lift pin driving device 170 may include a plurality of pin plates 180 operated by one drive motor 171 to move the lift pins 160 upwards or downwards. As shown in FIG. 11 and FIG. 12, the plurality of pin plates 180 may be positioned below the chamber body 150 to receive the lower ends of the respective lift pins 160. The lift pin driving device 170 may also include a drive unit that moves the pin plates 180 simultaneously upwards or simultaneously downwards, and a vertical guide 185 that guides the upward or downward movement of the pin plates 180.

In certain embodiments, the pin plates 180 may be arranged in the peripheral region, which is located around the central region of the space below the chamber body 150, as shown in FIG. 12. Thus, other required elements, such as, for example, a matching box R, may be positioned in the central region of the space below the chamber body 150. As discussed above, the matching box R is an electronic module used for applying RF power to the lower electrode assembly 154 when the process chamber 150 is configured as an RIE (Reactive Ion Etching) type chamber or the process chamber is changed from a PE (Plasma Enhanced) type chamber.

Each of the lift pins 160 may be secured to a pin plate 180. In certain embodiments, multiple, such as, for example, two or three lift pins 160, may be secured to each of the pin plates 180. This plurality of pin plates 180 allows for movement of respective lift pins 160 upwards or downwards as necessary.

The pin plates 180 may be coupled to each other using a link mechanism 177 and may be moved upwards or downwards by a drive unit to move the lift pins 160 upwards or downwards. A bellows 165 used for sealing each of the pinholes 158 of the chamber body 150 may be connected both to the lower surface of the chamber body 150 and to the upper end of each of the pin plates 180 or to the lower end of each of the lift pins 160.

The drive unit may include a drive plate 175 that moves upwards or downwards through a ball screw-type driving method, and a plurality of link mechanisms 177 that connect the respective pin plates 180 to the drive plate 175 in, for example, a radial structure, as shown in FIG. 12. Other arrangements may also be appropriate.

The drive plate 175 may have a plate structure of relatively small size, and may be placed at a central region in the space below the chamber body 150. The drive plate 175 may be moved upwards or downwards by one drive motor 171 and one ball screw 172. Guide means (not shown) may also be provided in the lift pin driving device 170 for guiding the rectilinear movement of the drive plate 175. Further, although ball screw-type driving method is shown in FIG. 11 through FIG. 13, it should be understood that another type of actuator capable of moving the drive plate 175 upwards or downwards may be used.

The link mechanisms 177 may function as linear mechanisms, and may be made of a material having sufficient strength to reduce strain during a power transmission process for executing vertical motion. Both ends of each of the link mechanisms 177 may be rotatably connected to the drive plate 175 and to its respective pin plate 180 through a variety of jointing methods, such as a ball jointing method or a hinge jointing method, which allow the ends of the link mechanism 177 to move relative to the drive plate 175 and to the pin plates 180.

As shown in FIG. 12, the link mechanisms 177 may be arranged in a peripheral region of the drive plate 175, and extend outward in radial directions. Further, the link mechanisms 177 may be inclined upwards and outwards, as shown in FIG. 11. Other arrangements may also be appropriate.

The vertical guide 185 may guide movement of the pin plates 180 and allow the pin plates 180 to be stably moved upwards or downwards when the plates 180 are moved by the drive unit. The vertical guide structure for guiding the movement of the pin plates 180 may be configured in a variety of ways. For example, in the embodiment shown in FIG. 11 through FIG. 13, the vertical guide structure is formed using both a rack 187 and a pinion 186.

More specifically, as shown in FIG. 13, the rack 187 may be vertically connected to a lower surface of the chamber body 150, while the pinion 186 may be mounted to a respective pin plate 180 and be engaged with the rack 187. Thus, when the pin plate 180 moves upwards or downwards, the pinion 186 moves upwards or downwards along the rack 187, and guides and supports the upward or downward movement of the pin plate 180. In alternative embodiments, the rack 187 may be provided on the pin plate 180, while the pinion 186 may be provided on the lower surface of the chamber body 150. To more stably support the pin plates 180, the rack 187 may be located outside and the pinion 186 be located inside, as shown in FIG. 12.

The vertical guide 185 may also include a guide rod 188 that extends longitudinally downwards from the lower end of the chamber body 150 and passes through the pin plate 180. A guide hole 180*a* may be formed in the pin plate 180, and a stop nut 189 may be formed on the lower end of the guide rod 188 so as to prevent the pin plate 180 from being separated from the guide rod 188.

In the lift pin driving device shown in FIG. 11 through FIG. 13, the plurality of pin plates 180 may be located in the peripheral region so as to avoid the central region of the space below the chamber body 150. Further, the single drive motor 171 may be located in a region below the central region of the space, and may move the plurality of pin plates 180 upwards or downwards at the same time. Thus, the layout of the space below the chamber body may be arranged in a variety of ways. Further, all the lift pins 160 may be moved simultaneously upwards or simultaneously downwards using the single drive motor 171. Further, the vertical guide 185 may be placed between each of the pin plates 180 and the chamber body 150 so that the pin plates 180 and the lift pins 160 can be moved upwards or downwards while being stably supported.

Figure 14:
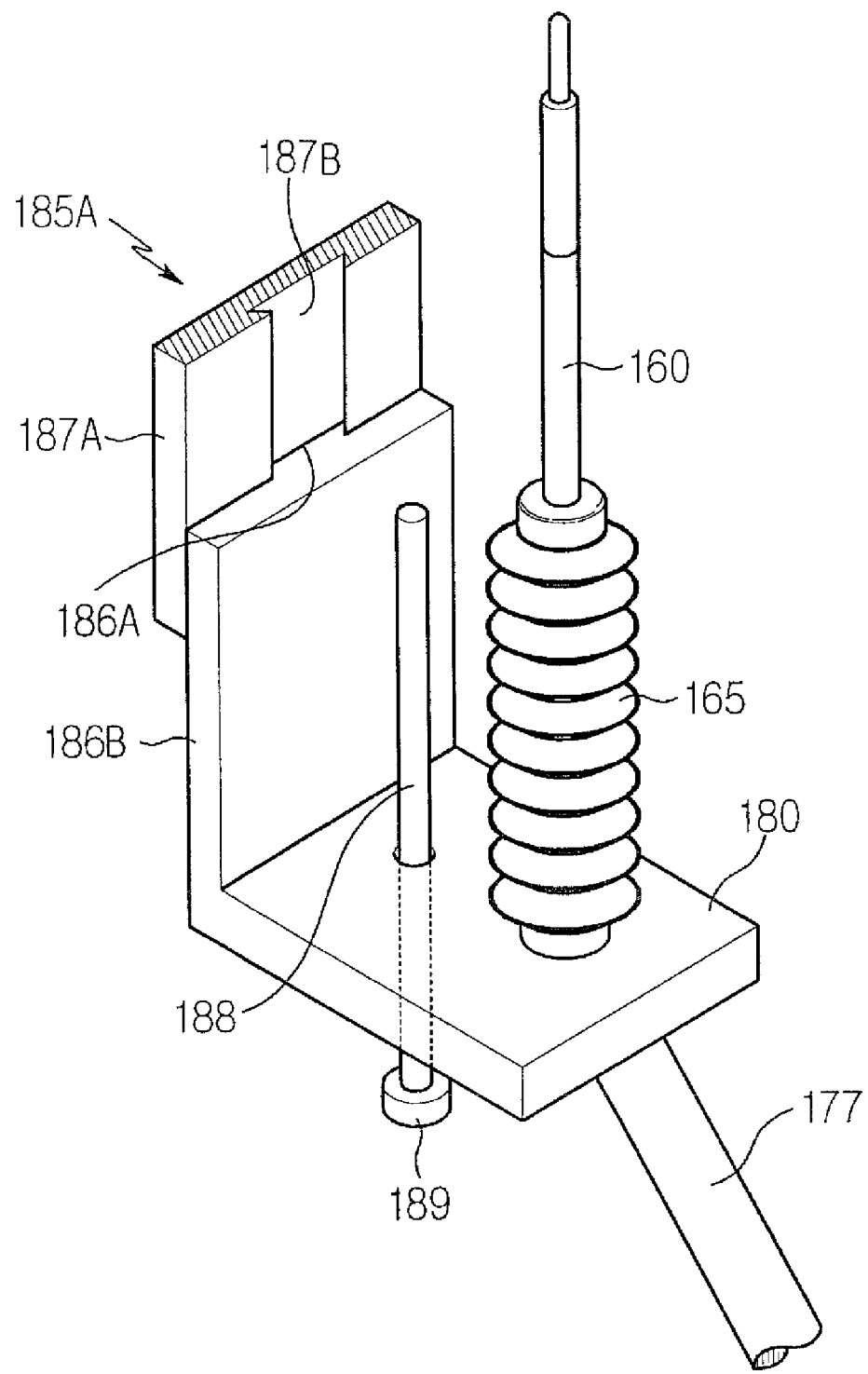
FIG. 14 is a partial perspective view of a portion of a lift pin driving device according to a sixth embodiment as broadly described herein.

FIG. 14 is a perspective view of a vertical guide according to another embodiment. As shown in FIG. 14, the vertical guide 185A may include a linear guide instead of a rack 187 and pinion 186 as discussed above with respect to FIG. 13. The linear guide may be an LM (Linear Motion) guide including a fixed block 187A having a guide groove 187B, and a movable block 186A having a guide protrusion 186B. The guide protrusion 186B may be movably engaged with the fixed block 187A in a dovetail engagement, or other arrangement as appropriate. The movable block 186A may be integrally formed on the pin plate 180.

Figure 15:
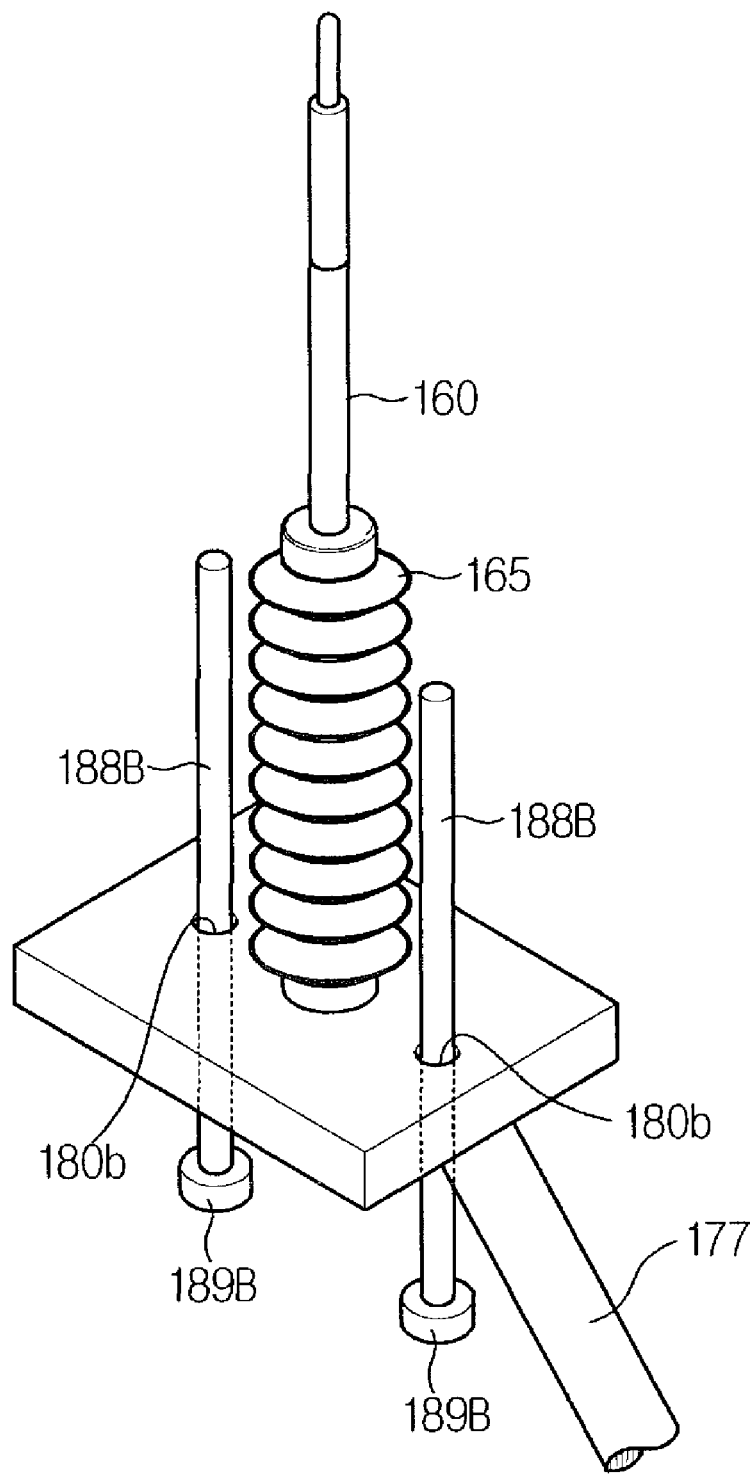
FIG. 15 is a partial perspective view of a portion of a lift pin driving device according to a seventh embodiment as broadly described herein.

FIG. 15 is a perspective view of a vertical guide according to another embodiment. As shown in FIG. 15, the vertical guide 185B may include two guide rods 188B. Two guide holes 180*b* may be formed in the pin plate 180, and two guide rods 188B, mounted to the lower part of the chamber body 150, may be inserted into the respective guide holes 180*b*, such that the vertical movement of the pin plate 180 can be guided by the two guide rods 188B.

A lift pin driving device and an FPD manufacturing apparatus having the device as embodied and broadly described herein may move a plurality of lift pins upwards or downwards using a cam-type driving method, instead of a conventional ball screw-type driving method, thus having a simple driving structure and efficiently moving the lift pins upwards or downwards.

A lift pin driving device and an FPD manufacturing apparatus having the device as embodied and broadly described herein may precisely move the lift pins upwards or downwards using one motor, thus easily controlling the motor and precisely moving the lift pins upwards or downwards.

A lift pin driving device and an FPD manufacturing apparatus having the device as embodied and broadly described herein may be easily used in a system having a large area and may enable the layout of the space below the chamber body to be constructed in a variety of types, and may reduce the cost of the equipment, thus reducing the production cost of products.

A lift pin driving device and an FPD manufacturing apparatus having the device as embodied and broadly described here, the pin plate may be divided into a plurality of plates, and the plurality of pin plates may be arranged to move the lift pins upwards or downwards in peripheral regions, which are located around the central region of the space below the chamber body, thus enabling the layout of the space below the chamber body to be constructed in a variety of types, and to reduce the cost of the equipment, thus reducing the production cost of products.

In a lift pin driving device and an FPD manufacturing apparatus having the device as embodied and broadly described herein, the lift pins may be precisely moved upwards or downwards at the same time using one motor, thus easily controlling the motor and precisely moving the lift pins upwards or downwards.

A lift pin driving device as embodied and broadly described herein may include a plurality of lift pins, arranged such that they pass through a substrate support unit, the lift pins moving a substrate upwards or downwards; a drive shaft rotatably mounted to a mounting structure at a location below the substrate support unit; a drive unit for rotating the drive shaft; and a cam mounted to the drive shaft and rotated by the drive shaft, thus moving the lift pins upwards or downwards.

In certain embodiments, the substrate support unit may be configured as a lower electrode assembly.

In certain embodiments cam may be configured such that it is in direct contact with the lower ends of the lift pins, as shown in FIG. 4 through FIG. 8.

In alternative embodiments, the lift pins may be fixed to a pin plate, and the cam may be configured to move the pin plate upwards or downwards, thus moving the lift pins upwards or downwards, as shown in FIG. 9 and FIG. 10.

The drive shaft may include a plurality of drive shafts, which are configured to be rotated by a power transmission unit at the same time. In this embodiment, the power transmission unit may include bevel gears, which may be provided on the respective drive shafts and may be engaged with each other.

In certain embodiments, plurality of drive shafts may be arranged in a polygonal arrangement.

In alternative embodiments, an additional drive shaft may be provided in a space defined by the drive shafts arranged in the polygonal arrangement, as shown in FIG. 8.

One of the plurality of drive shafts may be configured to receive rotational power from the drive unit. In this embodiment, the drive unit may include a motor, and the motor and the drive shaft may transmit power to each other through a worm gear or a bevel gear.

In alternative embodiments, the drive unit may include a motor, and the shaft of the motor may be directly connected to one of the plurality of drive shafts, thus transmitting power to the drive shaft, as shown by the dotted line in FIG. 7.

An FPD manufacturing apparatus having a lift pin driving device as embodied and broadly described herein may include a chamber body, having a pin passing unit in a lower part thereof; a support unit provided in the chamber body to support a substrate thereon, with a plurality of pin passing units formed in the support unit; and the lift pin driving device placed in a space below the chamber body and driving a plurality of lift pins provided in the pin passing units of both the chamber body and the support unit, thus moving the substrate upwards or downwards.

The chamber body may be provided therein with an upper electrode assembly for spraying process gas and generating plasma, and treating a surface of the substrate, and the support unit may comprise a lower electrode assembly, placed below the upper electrode assembly so that they face each other.

The lift pin driving device and the FPD manufacturing apparatus having the device as embodied and broadly described herein may move the lift pins upwards or downwards using a cam-type driving method, instead of the conventional ball screw-type driving method, thus having a simple driving structure and efficiently moving the lift pins upwards or downwards.

Further, the system and method as embodied and broadly described herein may precisely move the lift pins upwards or downwards using one motor, thus easily controlling the motor and precisely moving the lift pins upwards or downwards.

Further, the system and method as embodied and broadly described herein may be easily used in a system having a large area, and may enable the layout of the space below the chamber body to be constructed in a variety of types, and may reduce the cost of the equipment, thus reducing the production cost of products.

A lift pin driving device as embodied and broadly described herein may include a plurality of lift pins, arranged such that they pass through a substrate support unit, the lift pins moving a substrate upwards or downwards; a plurality of pin plates, to which the lower ends of the respective lift pins are securely mounted; a drive unit, connected to the plurality of pin plates through a link mechanism and simultaneously moving the pin plates upwards or downwards; and a vertical guide for guiding the upward or downward movement of the pin plates.

In certain embodiments, the substrate support unit may be configured as a lower electrode assembly.

The pin plates may be arranged in a peripheral region, which is located around the center of a space below the substrate support unit.

The drive unit may include a drive plate, moved upwards or downwards through a ball screw-type method; and a plurality of link mechanisms connecting the drive plate to the respective pin plates.

In certain embodiments, the vertical guide may include a rack and a pinion, which are provided in the support unit and in each of the pin plates, respectively, such that the rack and pinion are engaged with each other and guide the upward or downward movement of the pin plates, as shown in FIG. 11 through FIG. 13.

In alternative embodiments, the vertical guide may include linear guides, which are provided in the support unit and each of the pin plates, respectively, such that the linear guides are engaged with each other through male and female engagement, as shown in FIG. 14.

In certain embodiments, each of the two types of vertical guides may also include a plurality of guide rods, which extend from the lower part of the support unit a predetermined length and pass through the respective pin plates.

In alternative embodiments, the vertical guide may include only a plurality of guide rods, which extend from the lower part of the support unit to a predetermined length and pass through the respective pin plates, as shown in FIG. 15.

A FPD manufacturing apparatus having a lift pin driving device as embodied and broadly described herein may include a chamber body having a pin passing unit in a lower part thereof; a support unit provided in the chamber body to support a substrate thereon, with a plurality of pin passing units formed in the support unit; and the lift pin driving device placed in a space below the chamber body and driving a plurality of lift pins provided in the pin passing units of both the chamber body and the support unit, thus moving the substrate upwards or downwards.

In certain embodiments, the chamber body may be provided therein with an upper electrode assembly for spraying process gas and generating plasma, and treating a surface of the substrate, and a lower electrode assembly may be placed below the upper electrode assembly and constitute the support unit.

A lift pin driving device and a FPD manufacturing apparatus having the device as embodied and broadly described herein may include a plurality of pin plates for moving respective lift pins, thus enabling the layout of the space below the chamber body to be constructed in a variety of types without causing interference between the lift pin driving device and surrounding elements. Further, the plurality of pin plates may be arranged to move the lift pins upwards or downwards in peripheral regions, which are located around the central region of the space below the chamber body, thus enabling the space below the chamber body to be constructed in a variety of types. In a system and method as embodied and broadly described herein, the cost of the equipment may be reduced, thereby reducing the production cost of products.

Further, in a system and method as embodied and broadly described herein, the lift pins may be precisely moved upwards or downwards at the same time using one motor, thus easily controlling the motor and precisely moving the lift pins upwards or downwards.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lift pin driving device configured for use with a substrate support in a flat panel manufacturing device, comprising a driving structure, comprising:
    a plurality of shafts coupled together at respective ends thereof so as to form a closed polygonal arrangement of shafts that define an open central portion; and
    a single driver configured to rotate one of the plurality of shafts, wherein the respective ends of the plurality of shafts are coupled such that rotation of the one of the plurality of shafts causes the plurality of shafts to all rotate in the same direction simultaneously; and
    a plurality of lift pins coupled to the driving structure, wherein the plurality of lift pins are configured to move vertically through a substrate support positioned above the driving structure as the single driver rotates the one of the plurality of shafts;
    wherein each of the plurality of lift pins is coupled to one of the plurality of shafts by a cam.

2. The device of claim 1, wherein the plurality of lift pins are configured to move simultaneously upwards and simultaneously downwards through the substrate support as the driver rotates the one of the plurality of shafts.

3. The device of claim 1, wherein an upper end of each of the plurality of lift pins contacts a lower surface of a substrate positioned on the substrate support so as to lift or lower the substrate as the plurality of lift pins move vertically through the substrate support.

4. The device of claim 1, wherein the single driver comprises:
    a single motor; and
    a drive shaft coupled between the single motor and the one of the plurality of shafts, wherein the drive shaft is configured to transmit a rotational force from the single motor to the one of the plurality of shafts so as to rotate the one of the plurality of shafts.

5. The device of claim 4, wherein the drive shaft is coupled to the one of the plurality of shafts by a worm gear unit or a bevel gear unit.

6. The device of claim 5, wherein the drive shaft and motor are positioned at an outside of an outer periphery of the closed polygonal arrangement of shafts.

7. The device of claim 4, further comprising a power transmission unit configured to transmit the rotational force received by the one of the plurality of shafts to the remaining plurality of shafts such that the plurality of shafts rotate together to move the driving structure upwards and downwards.

8. The device of claim 7, wherein the power transmission unit comprises bevel gears provided at a coupling between the respective ends of the plurality of shafts such that rotation of the one of the plurality of shafts rotates the remaining plurality of shafts.

9. The device of claim 8, wherein a rotation of the plurality of shafts moves the plurality of lift pins fixed thereto simultaneously upwards or simultaneously downwards based on a direction of rotation of the drive shaft.

10. The device of claim 7, wherein a lower end of each of the plurality of lift pins is coupled to a respective shaft of the plurality of shafts, and wherein the plurality of lift pins move simultaneously upwards or simultaneously downwards based on a direction of rotation of the drive shaft.

11. The device of claim 10, wherein the single driver comprises a single motor that moves the plurality of lift pins simultaneously upwards or simultaneously downwards.

12. A flat panel display manufacturing apparatus comprising the lift pin driving device of claim 1.

* * * * *